United States Patent
Magee et al.

(10) Patent No.: US 10,009,197 B1
(45) Date of Patent: Jun. 26, 2018

(54) METHOD AND APPARATUS FOR INTERSYMBOL INTERFERENCE COMPENSATION

(71) Applicant: Xilinx, Inc., San Jose, CA (US)

(72) Inventors: Terence J. Magee, San Francisco, CA (US); Asim A. Patel, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/289,680

(22) Filed: Oct. 10, 2016

(51) Int. Cl.
  *H04L 25/03* (2006.01)
  *H04L 7/00* (2006.01)

(52) U.S. Cl.
  CPC ...... *H04L 25/03267* (2013.01); *H04L 7/0037* (2013.01); *H04L 25/03057* (2013.01)

(58) Field of Classification Search
  CPC ......... H04L 25/03267; H04L 25/03057; H04L 7/0037
  USPC ....................................................... 375/233
  See application file for complete search history.

(56) References Cited

U.S. PATENT DOCUMENTS

| | | | |
|---|---|---|---|
| 6,807,125 B2 | 10/2004 | Coteus et al. | |
| 9,237,041 B1 | 1/2016 | An et al. | |
| 9,355,696 B1 | 5/2016 | Magee et al. | |
| 2006/0291550 A1* | 12/2006 | Wang | H04L 25/03057 375/229 |
| 2010/0103999 A1* | 4/2010 | Leibowitz | H04L 25/03057 375/233 |
| 2017/0222796 A1* | 8/2017 | Chen | H04L 7/033 |

* cited by examiner

*Primary Examiner* — Michael Neff
(74) *Attorney, Agent, or Firm* — Hong Shi; David O'Brien

(57) ABSTRACT

An intersymbol interference (ISI) compensation circuit includes a data input for receiving an input data signal including a plurality of bits. An adjustment circuit is configured to adjust bit periods of the bits to generate a first adjusted signal and a second adjusted signal. A sampling circuit is configured to generate a first sample signal by sampling the first adjusted signal, and generate a second sample signal by sampling the second adjusted signal. A decision generation circuit is configured to provide a first decision for a first bit. The first decision provides a chosen adjusted signal that is one of the first and second adjusted signals. A selection circuit is configured to determine a compensated value of the first bit based on a chosen sample signal that is one of the first and second sample signals. The chosen sample signal is generated by sampling the chosen adjusted signal.

20 Claims, 8 Drawing Sheets

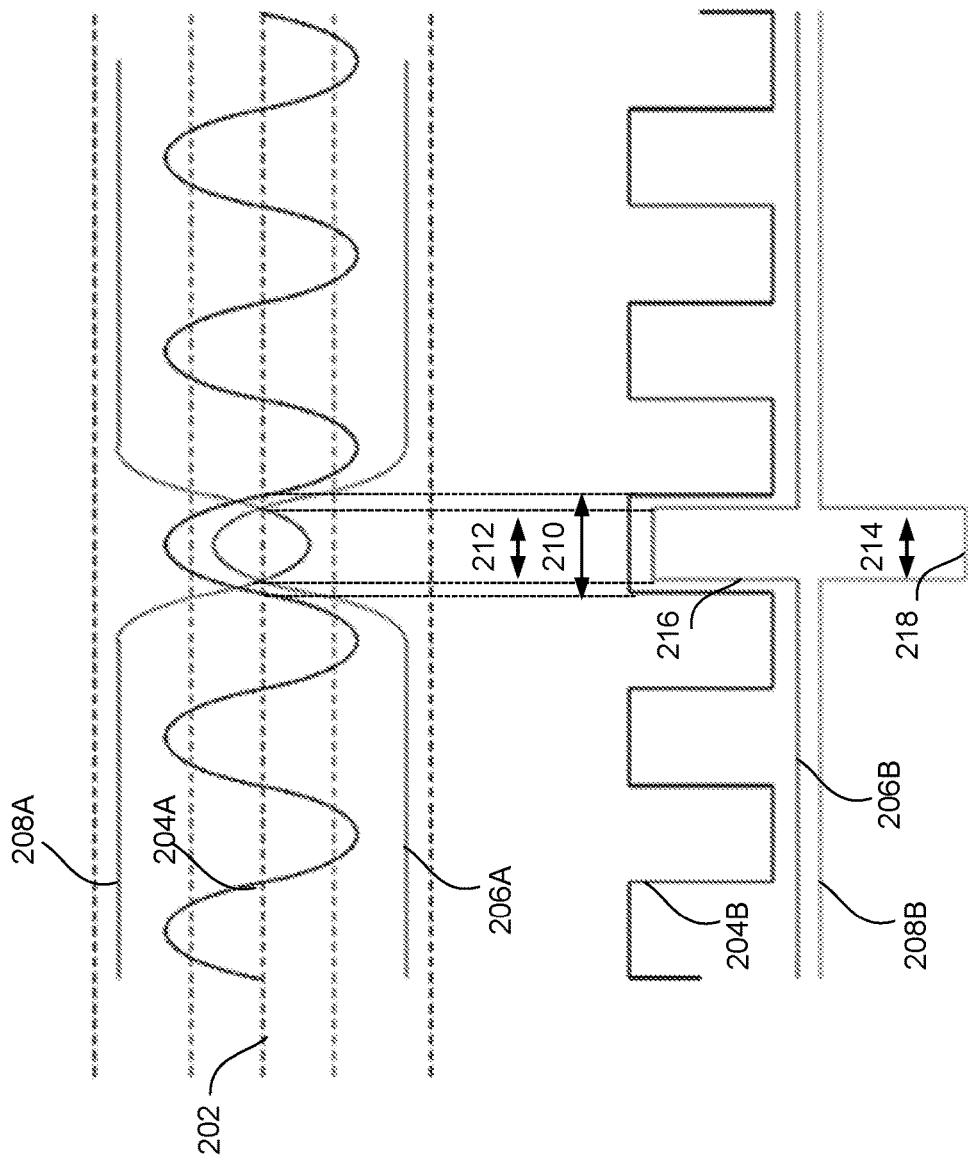

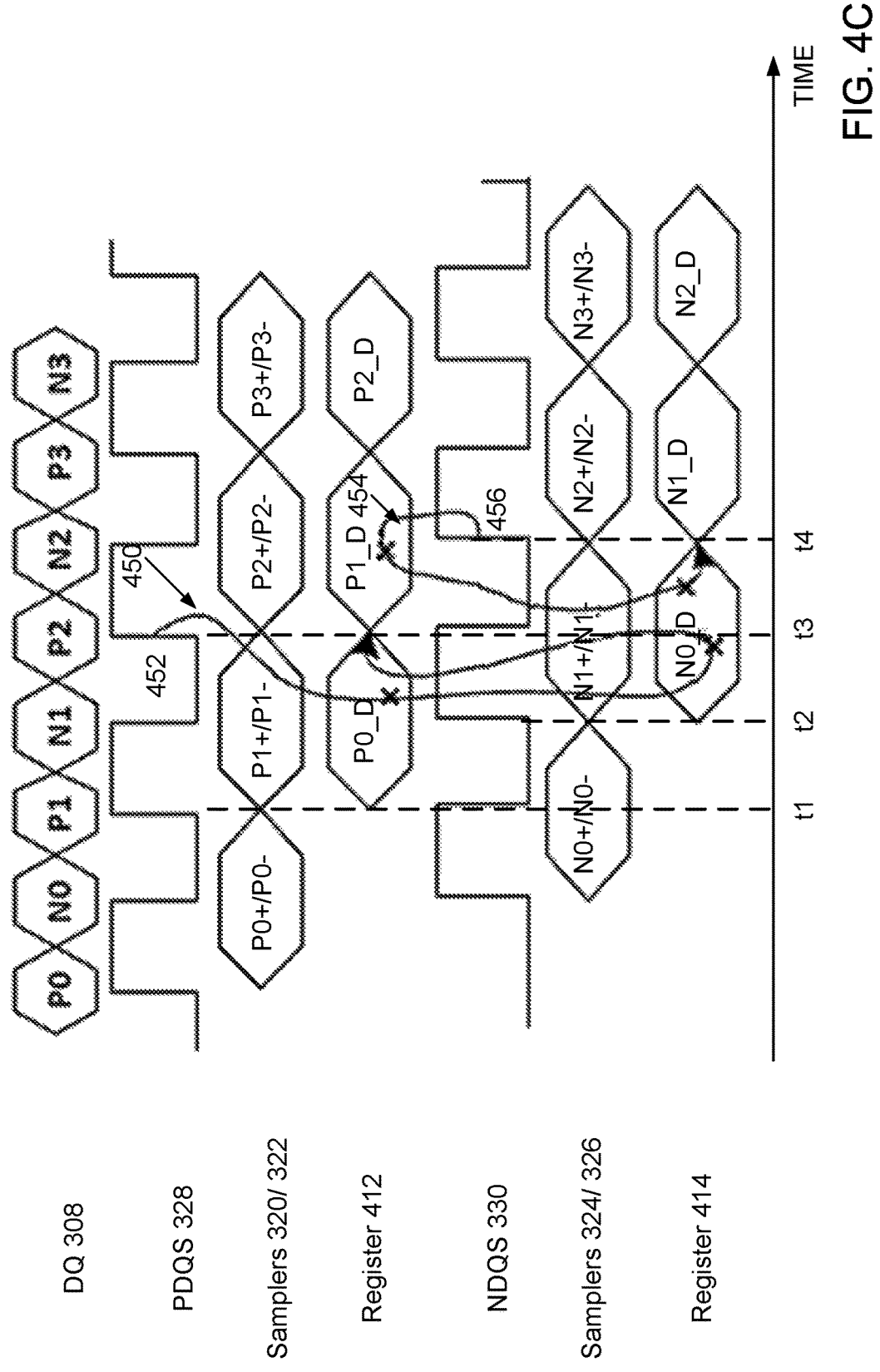

METHOD AND APPARATUS FOR INTERSYMBOL INTERFERENCE COMPENSATION

TECHNICAL FIELD

Examples of the present disclosure generally relate to integrated circuits ("ICs") and, in particular, to an embodiment related to circuits for intersymbol interference compensation.

BACKGROUND

As data rates increase to meet demand for higher data throughput, signals transmitted through a communication channel are increasing susceptible to corruption by frequency-dependent signal loss of the communication channel, such as intersymbol interference (ISI), and other noise, such as crosstalk, echo, signal dispersion, and distortion. A decision feedback equalizer (DFE) may be used to remove ISI and other noise by using a feedback loop based on previously decided symbols from the received signal. However, a conventional DFE may require an accurate selection of the coefficients of its finite impulse response (FIR) filter. It may be difficult to provide an accurate selection of the coefficients, which may be different for each receive channel. Using a DFE with inaccurate coefficients may reduce the sampling margin (e.g., timing margin and/or voltage margin), and negatively affect the IC performance. Furthermore, a conventional DFE for compensating ISI may consume significant power and require more area.

Accordingly, it would be desirable and useful to provide a way of intersymbol interference compensation addressing some of those concerns.

SUMMARY

In some embodiments in accordance with the present disclosure, an intersymbol interference (ISI) compensation circuit includes a data input for receiving an input data signal including a plurality of bits; an adjustment circuit configured to adjust bit periods of the plurality of bits to generate a first adjusted signal and a second adjusted signal; a sampling circuit configured to generate a first sample signal by sampling the first adjusted signal, and generate a second sample signal by sampling the second adjusted signal; a decision generation circuit configured to provide a first decision for a first bit, wherein the first decision provides a chosen adjusted signal that is one of the first and second adjusted signals; and a selection circuit configured to determine a compensated value of the first bit based on a chosen sample signal that is one of the first and second sample signals, wherein the chosen sample signal is generated by sampling the chosen adjusted signal.

In some embodiments, the adjustment circuit includes a first adjustment unit configured to generate the first adjusted signal by increasing bit periods of a first group of bits in the input data signal having a first value and decreasing bit periods of a second group of bits in the input data signal having a second value; and a second adjustment unit configured to generate the second adjusted signal by decreasing bit periods of the first group of bits and increasing bit periods of the second group of bits.

In some embodiments, the decision generation circuit is configured to generate the first decision for the first bit based on values of a second bit immediately preceding the first bit and a third bit immediately preceding the second bit.

In some embodiments, the decision generation circuit is configured to: compare compensated values of the second bit and the third bit to generate a comparison result; and provide the first decision for the first bit determined according to the comparison result.

In some embodiments, the decision generation circuit is configured to determine that compensated values of the second bit and the third bit are the same and in response, determining that the first decision for the first bit provides the chosen adjusted signal that is the same as a chosen adjusted signal provided by a second decision for the second bit.

In some embodiments, the decision generation circuit is configured to determine that compensated values of the second bit and the third bit are different and in response, determining that the first decision for the first bit provides the chosen adjusted signal that is different from a chosen adjusted signal provided by a second decision for the second bit.

In some embodiments, the adjustment circuit includes a delay unit configured to delay the input data signal for a delay period to generated a delayed data signal. The first adjustment unit is configured to perform an AND operation on the input data signal and the delayed data signal to generate the first adjusted signal. The second adjustment unit is configured to perform an OR operation on the input data signal and the delayed data signal to generate the second adjusted signal.

In some embodiments, the first bit is affected by ISI, and the delay period is equal to or greater than a bit-period reduction to the first bit caused by ISI.

In some embodiments, a second bit in the input data signal is not affected by ISI and has a first bit period, and the delay period is less than a total of the first bit period and the bit-period reduction.

In some embodiments, the sampling circuit includes first and second samplers clocked by a first clock and configured to generate the first and second sample signals for odd bits of the input data signal by sampling the first adjusted signal and second adjusted signal respectively; third and fourth samplers clocked by a second clock and configured to generate third and fourth sample signals for even bits of the input data signal by sampling the first and second adjusted signals respectively. The selection circuit is configured to, for an odd bit of the input data signal, determine a compensated value of the odd bit based on a first chosen sample signal that is one of the first and second sample signals, wherein the first chosen sample signal is generated by sampling the chosen adjusted signal; and for an even bit of the input data signal, determine a compensated value of the even bit based on a second chosen sample signal that is one of the third and fourth sample signals, wherein the second chosen sample signal is generated by sampling the chosen adjusted signal.

In some embodiments in accordance with the present disclosure, a method includes receiving an input data signal including a plurality of bits; adjusting bit periods of the plurality of bits to generate a first adjusted signal and a second adjusted signal; generating a first sample signal by sampling the first adjusted signal; generating a second sample signal by sampling the second adjusted signal; providing a first decision for a first bit, wherein the first decision provides a chosen adjusted signal that is one of the first and second adjusted signals; and determining a compensated value of the first bit based on a chosen sample signal that is one of the first and second sample signals, wherein the chosen sample signal is generated by sampling the chosen adjusted signal.

In some embodiments, the method includes generating the first adjusted signal by increasing bit periods of a first group of bits in the input data signal having a first value and decreasing bit periods of a second group of bits in the input data signal having a second value; and generating the second adjusted signal by decreasing bit periods of the first group of bits and increasing bit periods of the second group of bits.

In some embodiments, the method includes generating the first decision for the first bit based on values of a second bit immediately preceding the first bit and a third bit immediately preceding the second bit.

In some embodiments, the method includes comparing compensated values of the second bit and the third bit to generate a comparison result; and providing the first decision for the first bit determined according to the comparison result.

In some embodiments, the method includes determining that compensated values of the second bit and the third bit are the same and in response, determining that the first decision for the first bit provides the chosen adjusted signal that is the same as a chosen adjusted signal provided by a second decision for the second bit.

In some embodiments, the method includes determining that compensated values of the second bit and the third bit are different and in response, determining that the first decision for the first bit provides the chosen adjusted signal that is different from a chosen adjusted signal provided by a second decision for the second bit.

In some embodiments, the method includes delaying the input data signal for a delay period to generated a delayed data signal; performing an AND operation on the input data signal and the delayed data signal to generate the first adjusted signal; and performing an OR operation on the input data signal and the delayed data signal to generate the second adjusted signal.

In some embodiments, the method includes generating the first and second sample signals for odd bits of the input data signal by sampling the first adjusted signal and second adjusted signal respectively using a first clock; generating third and fourth samplers clocked by a second clock different from the first clock and configured to generate third and fourth sample signals for even bits of the input data signal by sampling the first and second adjusted signals respectively; for an odd bit of the input data signal, determining a compensated value of the odd bit based on a first chosen sample signal that is one of the first and second sample signals, wherein the first chosen sample signal is generated by sampling the chosen adjusted signal; and for an even bit of the input data signal, determining a compensated value of the even bit based on a second chosen sample signal that is one of the third and fourth sample signals, wherein the second chosen sample signal is generated by sampling the chosen adjusted signal.

Other aspects and features will be evident from reading the following detailed description and accompanying drawings.

BRIEF DESCRIPTION OF THE DRAWINGS

FIGS. 2A and 2B illustrate timing diagrams of analog input signals and the corresponding converted digital signals.

FIG. 4C illustrates a timing diagram of the exemplary ISI compensation circuit of FIG. 3A using the decision generation circuit of FIG. 4B according to some embodiments of the present disclosure.

DETAILED DESCRIPTION

Figure 1:
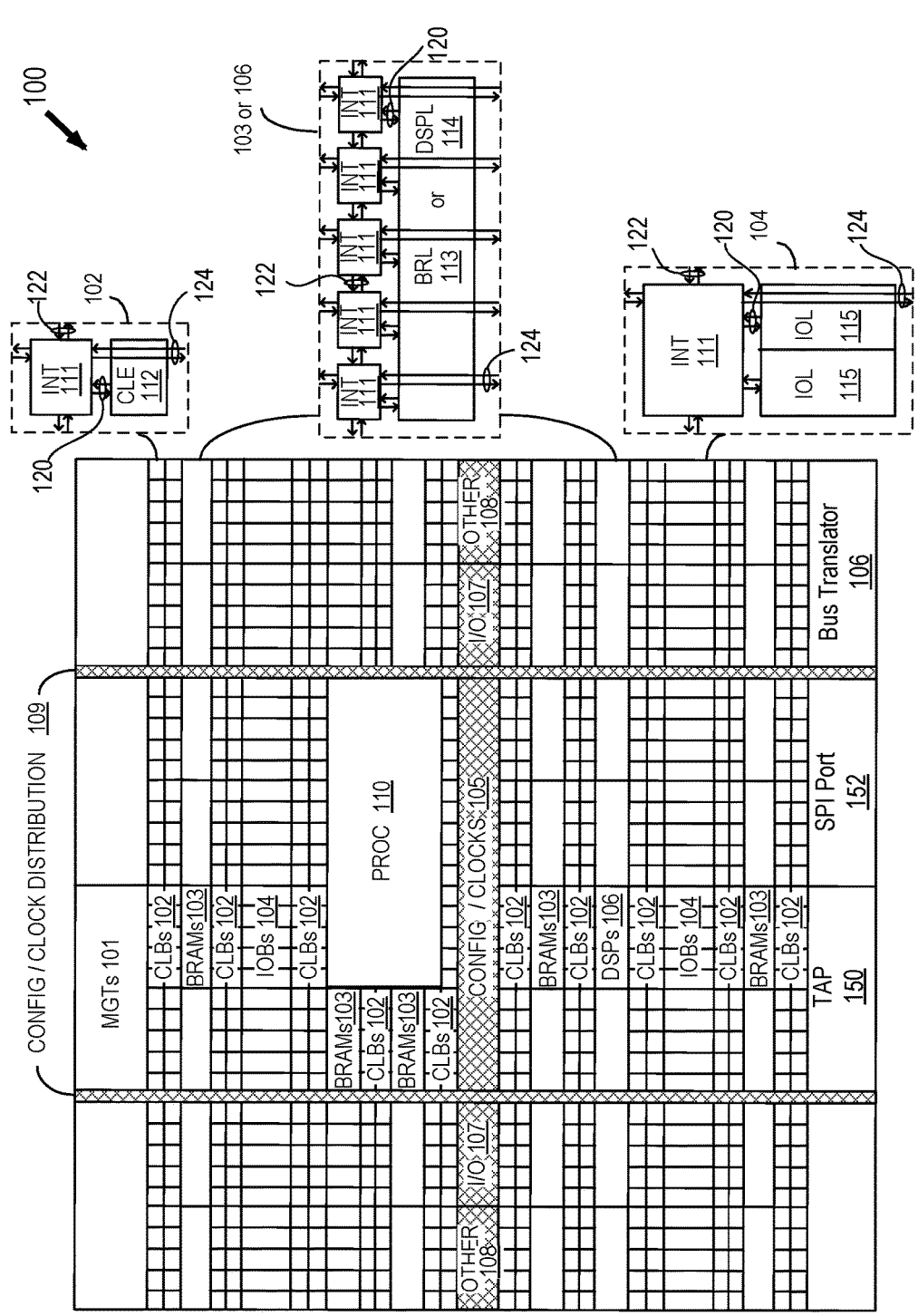
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As data rates increase, signals transmitted through a communication channel are increasing susceptible to ISI and other distortions. Compensating for ISI in the analog domain (e.g., by using a DFE) before a received analog signal is converted to a digital signal may consume significant power and require more area. It has been discovered that by compensating for ISI in the digital domain after the received analog signal is converted to a digital signal may improve IC performance in power consumption, bit error rate, and area saving. As described below in additional detail, in a digital signal, the effect of ISI may be shown as a reduction of the time period of a bit in the digital signal. The time duration of a bit may also be referred to as a bit period. By adjusting the bit periods of the bits prior to sampling, the sampling margin for those bits may be recovered. Accordingly, an improving bit error rate performance may be achieved.

With the above general understanding borne in mind, various embodiments for ISI compensation are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

It is noted that the IC that may implement the ISI compensation is not limited to the exemplary IC depicted in FIG. 1, and that IC having other configurations, or other types of IC, may also implement the ISI compensation.

FIGS. 2A and 2B illustrate timing diagrams of analog input signals and the corresponding converted digital signals (e.g., generated using an analog-to-digital converter (ADC)). As shown in the examples of FIGS. 2A and 2B, a bit period of a bit may depend on the patterns of the analog input signals, where a fixed reference voltage 202 is used to digitize those analog input signals. The analog input signal 204A illustrates an ideal pattern with no ISI distortion. As such, bits in the digital signal 204B corresponding to the analog input signal 204A have the same time duration 210, which may be referred to as an ideal bit period 210. In some examples, as shown by analog input signals 206A and 208A, ISI may affect the patterns of the analog input signals, thereby affecting the bit periods of bits in the corresponding resulting digital signals. For example, the bit 216 in the digital signal 206B has a bit period 212 less than the ideal bit period 210. Similarly, the bit 218 in the digital signal 208B has a bit period 214 less than the ideal bit period 210. Such a reduction in the bit periods may reduce the timing margin for sampling those bits, and affect the bit error ratio performance of a receiver.

Figure 3A:
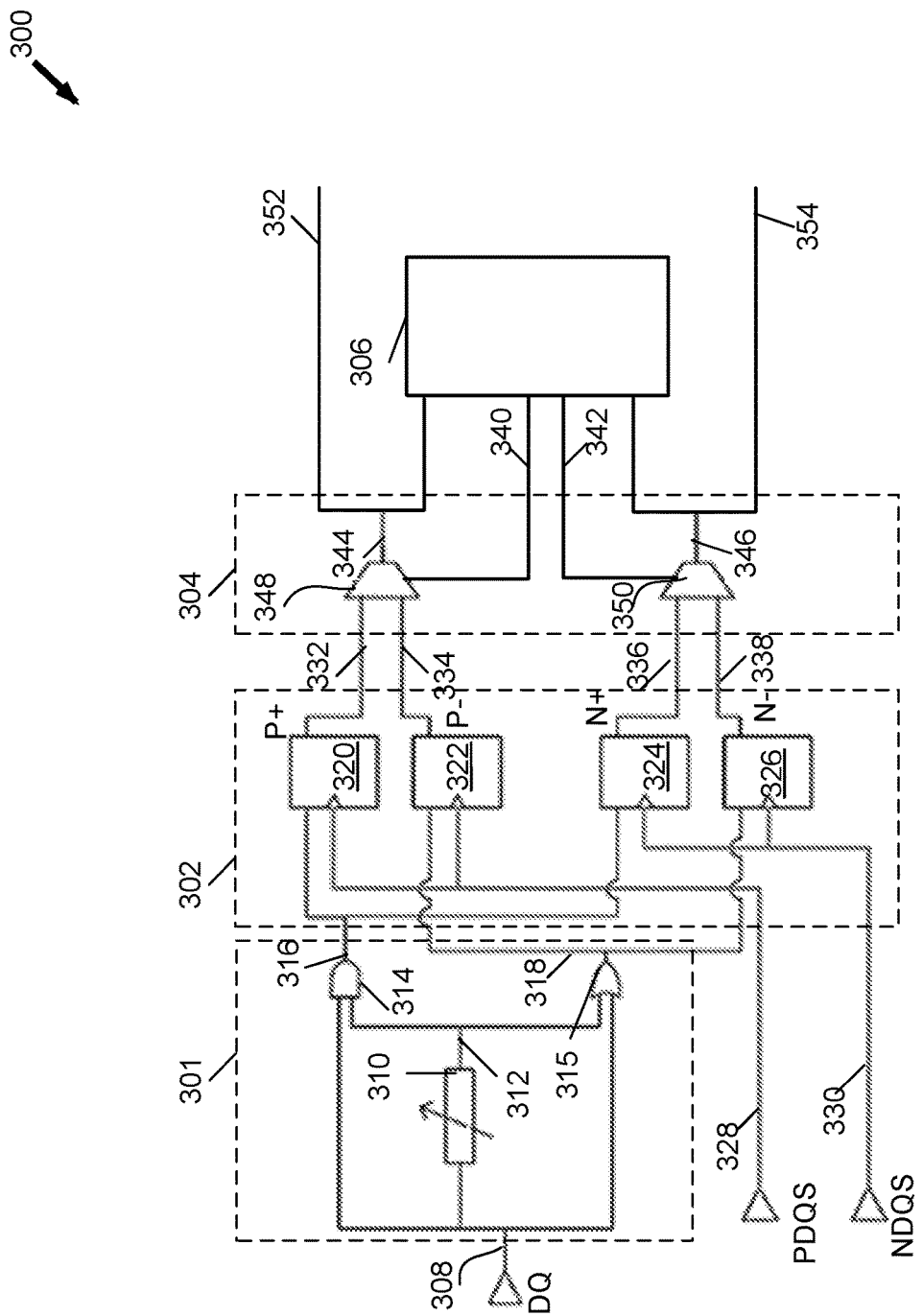
FIG. 3A is a block diagram illustrating an exemplary ISI compensation circuit according to some embodiments of the present disclosure.

Referring to FIG. 3A, illustrated is an exemplary ISI compensation circuit for compensating ISI effects on high-speed double-data-rate (DDR) receive data (DQ). The ISI compensation circuit 300 includes a bit-period adjustment circuit 301 (also referred to as an adjustment circuit 301) for adjusting the bit periods of the bits in the received signal. A sampling circuit 302 is coupled to the adjustment circuit 301 to generate a plurality of samples for each bit using those adjusted signals provided by the adjustment circuit 301. A selection circuit 304 may select a sample for each bit from the plurality of samples generated by the sampling circuit 302 according to a decision provided by a decision generation circuit 306. The adjustment circuit 301, the sampling circuit 302, the selection circuit 304, the decision generation circuit 306, and each of their blocks may be implemented in hardware, software, or a combination of hardware and software. For purposes of clarity and not limitation, in some embodiments, the adjustment circuit 301, the sampling circuit 302, the selection circuit 304, the decision generation circuit 306, and each of their blocks may be implemented using various hardware resources, such as for example DSP slices, BRAM, and programmable resources of an FPGA. However, in other embodiments, digital signal processors, microprocessors, multi-core processors, memory, and/or other hardware may be used.

In some embodiments, the adjustment circuit 301 includes a delay unit 310 configured to receive a DQ signal 308. The delay unit 310 may delay the DQ signal 308 for a delay period (denoted as DLY) to generate a delayed DQ signal 312. In some examples, the adjustment circuit 301 includes adjustment units 314 and 315, which may perform different functions to apply different adjustments to the bit periods of the bits in the DQ signal 308. In some examples, the adjustment unit 314 includes an AND gate, which performs an AND function on the DQ signal 308 and delayed DQ signal 312 to adjust the bit periods of the bits in the DQ signal 308, and generates a bit-period adjusted signal 316 (also referred to as AND gated signal 316). Whether the AND function increases or decreases the bit period of a particular bit depends on the value of that particular bit. For example, if the value of that particular bit is zero, then the AND function may increase its bit period by DLY. For further example, if the value of that particular bit is one, then the AND function may decrease its bit period by DLY.

In some examples, the adjustment unit 315 includes an OR gate, which performs an OR function on the DQ signal 308 and delayed DQ signal 312 to adjust the bit periods of the bits in the DQ signal 308, and generates a bit-period adjusted signal 318 (also referred to as OR gated signal 318). Whether the OR function increases or decreases the bit period of a particular bit depends on the value of that particular bit. For example, if the value of that particular bit is zero, then the OR function may decrease its bit period by DLY. For further example, if the value of that particular bit is one, then the OR function may increase its bit period by DLY.

Figure 3B:
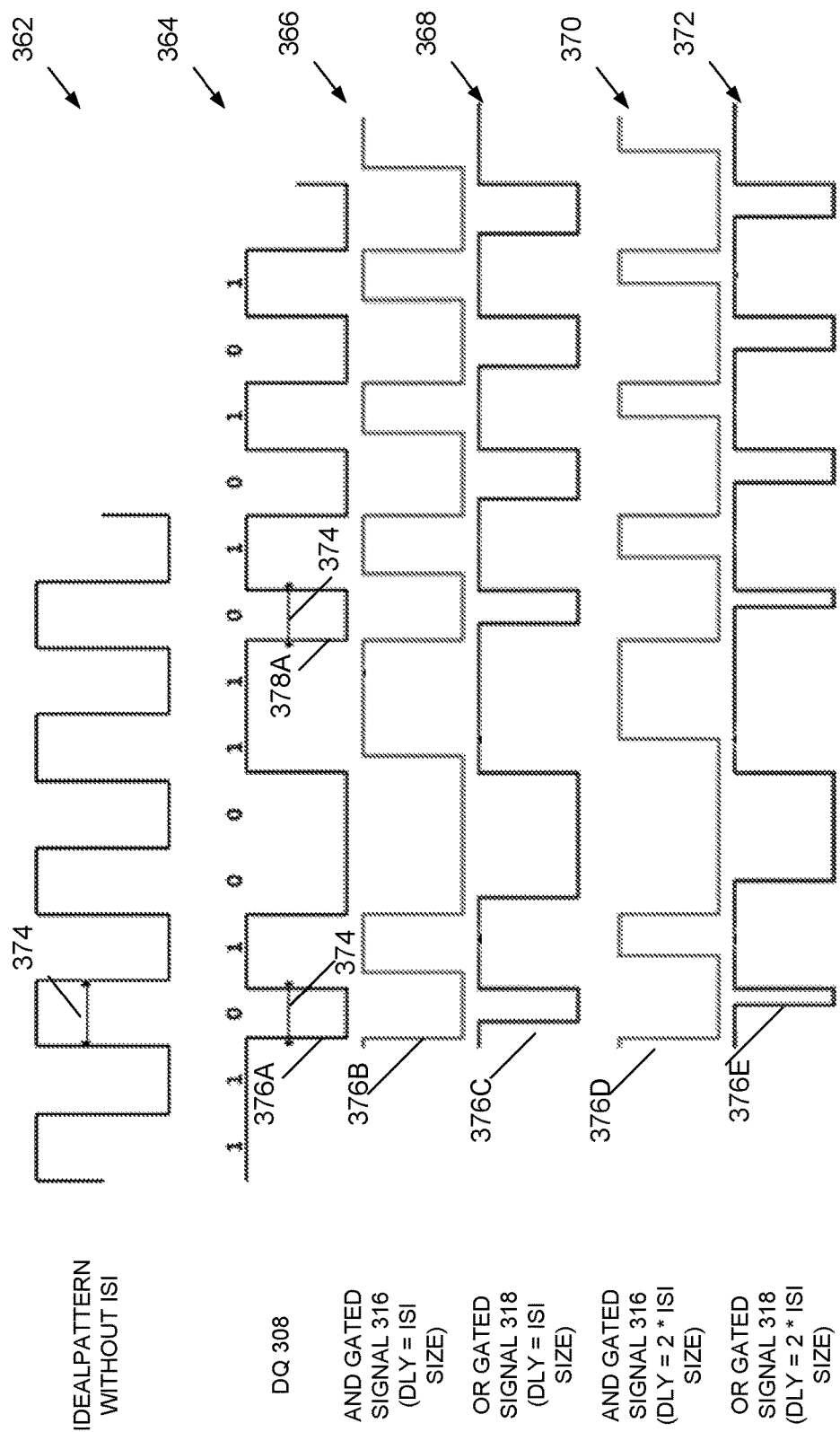
FIG. 3B illustrates a timing diagram of the exemplary ISI compensation circuit of FIG. 3A according to some embodiments of the present disclosure.

Referring to FIG. 3B, illustrated is an exemplary timing diagram for the adjustment circuit 301. The timing diagram includes a waveform 362 illustrating a signal with a pattern where ISI does not incur and a waveform 364 of the DQ signal 308. Waveforms 366 and 368 correspond to AND gated signal 316 and OR gated signal 318 respectively, where a delay period equal to a bit period reduction caused by ISI (also referred to as an ISI size) is applied. Waveforms 370 and 372 correspond to AND gated signal 316 and OR gated signal 318 respectively, where a delay period DLY is equal to twice the ISI size is applied.

The waveform 362 illustrates a signal having a pattern of "101010 . . . ," where ISI does not incur for such a pattern. A bit in that signal has a bit period 374, which may also be referred to as ideal bit period 374 or full bit period 574 as such a bit period is not affected by ISI.

The waveform 364 of the DQ signal 308 illustrates how ISI affects some bits in the DQ signal 308. For example, each of bits 376A and 378A has a value of zero following two consecutive ones, and is affected by ISI. Accordingly, each of bits 376A and 378A has a bit period less than the ideal bit period 374 (e.g., by an ISI size).

Waveforms 366 and 368 illustrate AND gated signal 316 and OR gated signal 318 respectively, where the delay unit 310 applies a delay period DLY equal to an ISI size. As shown in waveform 366 of AND gated signal 316, after performing an AND operation between DQ signal 308 and delayed DQ signal 312, bit periods of bits in DQ signal 308 having a value of zero are expanded (e.g., by DLY). For example, bit 376B in AND gated signal 316 has a bit period greater than the bit period of the corresponding bit 376A of DQ signal 308 (e.g., by DLY). The bit period of bit 376B is equal to or greater than the ideal bit period 374, which indicates that ISI has been removed. As such, bit 376B has a full bit period of timing margin for sampling. On the other hand, as shown in waveform 368 of OR gated signal 318, after performing an OR operation between DQ signal 308 and delayed DQ signal 312, bit periods of bits in DQ signal 308 having a value of zero are reduced (e.g., by DLY). For example, bit 376C in OR gated signal 318 has a bit period less than the bit period of the corresponding bit 376A of DQ signal 308 (e.g., by DLY).

Waveforms 370 and 372 are substantially similar to the waveforms 366 and 368 respectively, except that for waveforms 370 and 372, the delay unit 310 applies a delay period that is twice the ISI size. As such, bit 376D has a bit period that is about twice the ISI size greater than the bit period of the corresponding bit 376A of DQ signal 308 by about twice the ISI size, and bit 376E has a bit period that is less than the bit period of the corresponding bit 376A by about twice the ISI size. In some embodiments, increasing the delay period DLY to twice the ISI size may not affect the performance of the ISI compensation circuit 300. In some embodiments, the delay period DLY may be increased to one ideal bit period plus one ISI size without having a negative effect on the ISI compensation performance. As such, ISI may be removed without accurately determining either the value of the delay period DLY of the delay unit 310 or the value of the ISI size.

Referring to FIG. 3A, in some embodiments, the ISI compensation circuit 300 includes a sampling circuit 302 configured to receive the AND gated signal 316 and OR gated signal 318, and generate two samples for each bit using the AND gated signal 316 and OR gated signal 318 respectively. The sampling circuit 302 may include samplers 320 and 322 clocked by a clock signal 328 (also referred to as PDQS 328), and samplers 324 and 326 clocked by a clock signal 330 (also referred to as NDQS 330). Each of samplers 320, 322, 324, and 326 may include a positive-edge-triggered D flip-flop. PDQS 328 may be a single-rate clock used for sampling every odd data bits of the DQ signal 308, and NDQS 330 may be a single-rate clock used for sampling every even data bits of the DQ signal 308.

In some examples, for an odd bit (denoted as P) of the DQ signal 308, the sampler 320 may generate a first sample (denoted as P+) using a corresponding bit-period adjusted bit in the AND gated signal 316, and provide P+ in a sample signal 332. The sampler 322 may generate a second sample (denoted as P−) using a corresponding bit-period adjusted bit in the OR gated signal 318 and provide P− in a sample signal 334. As discussed above, the AND gated signal 316 and OR gated signal 318 include bits with adjusted bit periods. As such, depending on the value of the odd bit P, one of the samples P+ and P− has a timing margin at least equal to an ideal bit period for sampling and therefore is more likely to be sampled successfully. The other of the samples P+ and P− may have a timing margin less than an ideal bit period for sampling, and therefore is less likely to be sampled successfully. For example, if the odd bit P has a value of zero, the sample P+ may have a timing margin at least equal to an ideal bit period for sampling, and the sample P− may have a timing margin less than an ideal bit period for sampling. For further example, if the odd bit P has a value of one, the sample P+ may have a timing margin less than an ideal bit period for sampling, and the sample P− may have a timing margin at least equal to an ideal bit period for sampling.

In some examples, for an even bit (denoted as N) of the DQ signal 308, the sampler 324 may generate a first sample (denoted as N+) using a corresponding bit-period adjusted bit in the AND gated signal 316, and provide N+ in a sample signal 336. The sampler 326 may generate a second sample (denoted as N−) using a corresponding bit-period adjusted bit in the OR gated signal 318 and provide N− in a sample signal 338. As discussed above, the AND gated signal 316 and OR gated signal 318 include bits with adjusted bit periods. As such, depending on the value of the even bit N, one of the samples N+ and N− has a timing margin at least equal to an ideal bit period for sampling and therefore is more likely to be sampled successfully. The other of the samples N+ and N− may have a timing margin less than an ideal bit period for sampling, and therefore is less likely to be sampled successfully. For example, if the even bit N has a value of zero, the sample N+ may have a timing margin at least equal to an ideal bit period for sampling, and the sample N− may have a timing margin less than an ideal bit period for sampling. For further example, if the even bit N has a value of one, the sample N+ may have a timing margin less than an ideal bit period for sampling, and the sample N− may have a timing margin at least equal to an ideal bit period for sampling.

In some embodiments, the ISI compensation circuit 300 includes a selection circuit 304. The selection circuit 304 includes data inputs configured to receive sample signals 332, 334, 336, and 338 including samples P+, P−, N+, and N− respectively, and selection line inputs configured to receive decision signals 340 and 342 provided by the decision generation circuit 306. In some examples, the selection circuit 304 includes a selection device 348 (e.g., a multiplexer) having data inputs coupled to receive sample signals 332 and 334, and a selection line input coupled to receive a decision signal 340. For each odd bit P, the selection device 348 outputs a signal 344 including a sample selected from samples P+ and P− based on the decision signal 340. That sample may also be referred to as an ISI compensated value or compensated value of the odd bit P. In some examples, the selection circuit 304 includes a selection device 350 (e.g., a multiplexer) including data inputs coupled to receive sample signals 336 and 338, and a selection line input coupled to receive a decision signal 342. For each even bit N, the selection device 350 outputs a signal 346 including the sample selected from samples N+ and N− based on the decision signal 342. That sample may also be referred to as an ISI compensated value or compensated value of the even bit N. The signals 344 and 346 may be provided at outputs 352 and 354 of the ISI compensation circuit 300 to provide ISI compensated values of the bits.

Figure 4A:
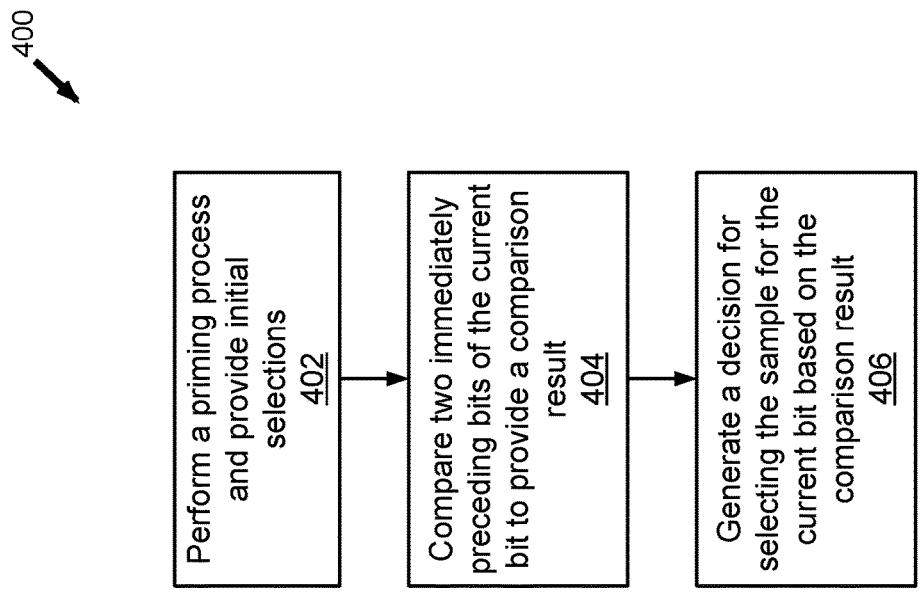
FIG. 4A is a flow diagram illustrating an exemplary method for generation decision signals according to some embodiments of the present disclosure.
Figure 4B:
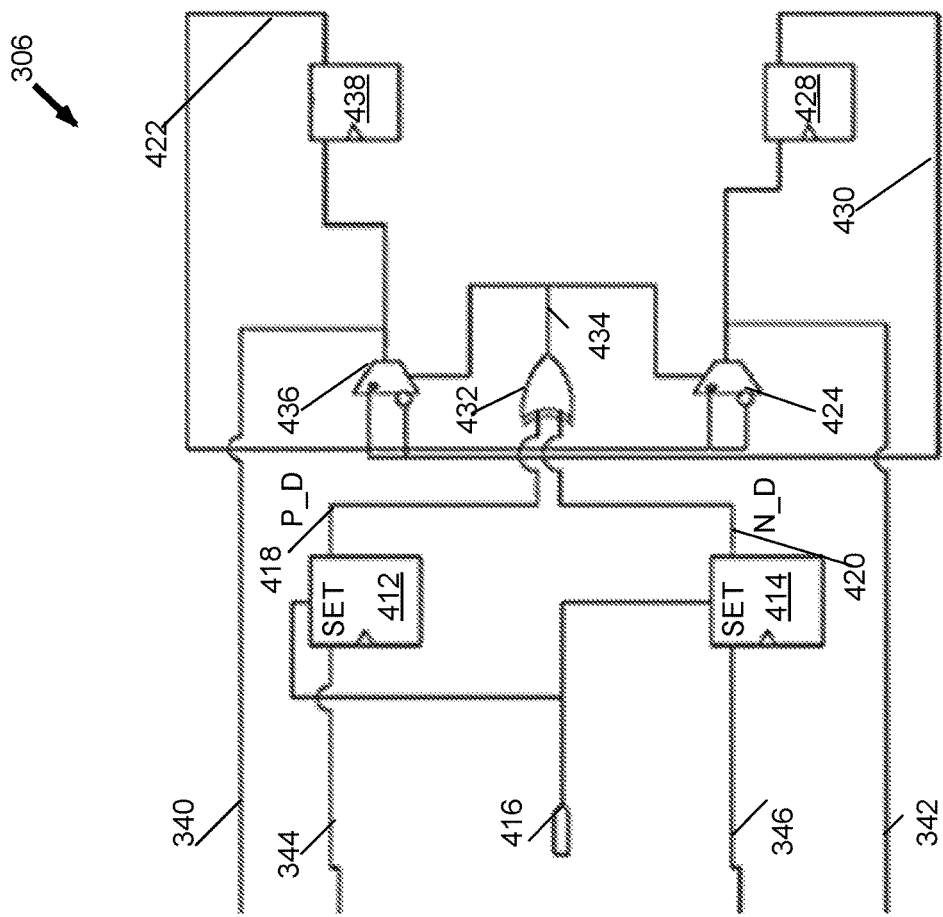
FIG. 4B is a block diagram illustrating an exemplary decision generation circuit according to some embodiments of the present disclosure.

In some embodiments, the ISI compensation circuit 300 includes a decision generation circuit 306 is configured to provide decision signals 340 and 342 to selection line inputs of the selection devices 348 and 350 of the selection circuit 304. Referring to FIGS. 4A, 4B, and 4C, decision signals 340 and 342 are provided to ensure that for each bit, the chosen sample has a timing margin at least equal to the idea bit period, thereby reducing or removing the effects caused by ISI. FIG. 4A is a flow diagram showing an example of a method 400 for generating decision signals for the selection circuit 304. FIG. 4B illustrates an exemplary block diagram of the decision generation circuit 306. FIG. 4C illustrates an exemplary timing diagram of the ISI compensation circuit 300.

Referring to FIG. 4A, the method 400 begins at block 402, where a priming process is performed. In some embodiments, a priming process is performed during an initial bring-up period of the decision generation circuit 306, such that the decision generation circuit 306 is configured based on an assumption that initial bits of a received bitstream have the same initial value (e.g., one). Referring to FIG. 4B, the decision generation circuit 306 may receive a prime signal from a prime input 416. The prime signal may be sent to the inputs (e.g., "SET" inputs) of registers 412 and 414 to set/reset the registers 412 and 414 according to the assumed particular value of the initial bits. In an example where the assumed initial value is one, an initial value of the decision signal 340 provides a decision for selecting samples P+ or N+ associated with the AND gated signal 316. In some examples, a training sequence including bits having the particular assumed initial value may be applied during the initial bring-up period. Alternatively, in some examples, the receiver is a pseudo-open drain logic (PODL) receiver, where the received data may be pulled to a particular value (e.g., one) during an idle period prior to a burst of data entering the PODL receiver. In such examples, a training sequence may not be applied.

Referring to FIG. 4A, the method 400 proceeds to block 404, where it is determined whether two immediately preceding bits of the current bit have the same value (e.g., based on compensated values of the two immediately preceding bits). Referring to FIG. 4B, the decision generation circuit 306 receives signals 344 and 346 from the selection circuit 304, and sends signals 344 and 346 to registers 412 and 414. The register 412 stores the chosen sample provided by the signal 344, and outputs a signal 418 having a delayed sample (denoted as P_D) to a comparison device 432. In the illustrated example, the comparison device 432 includes an XOR gate, and is also referred to as an XOR gate 432. The register 414 stores the chosen sample provided by signal 344, and outputs a signal 420 having a delayed sample (denoted as N_D) to the XOR gate 432. The XOR gate 432 performs an XOR function to compare the chosen samples P_D and N_D for the two immediately preceding bits, and generates a signal 434 indicating the comparison result.

Referring to FIG. 4A, in some embodiments, the method 400 proceeds to block 406 to generate a decision for selecting a sample for the current bit based on the comparison result. Such a decision is for selecting a sample from a first sample (e.g., P+, N+) generated using the AND gated signal 316 and a second sample (e.g., P−, N−) generated using the OR gated signal 318 based on the comparison result.

In some embodiments, after determining that P_D and N_D have the same value, the decision generation circuit 306 determines that the decision for the current bit is the same as the decision for the last bit. That decision for the current bit may be provided at the decision signal 340 (e.g., where the current bit is an odd bit) or at signal 342 (e.g., when the current bit is an even bit). In an example, the current bit is an odd bit. Accordingly, it is determined that the last bit is an even bit, and the decision for the last bit stored in register 428 is sent to a selection device 436 using signal 430. The selection device 436 receives signal 434 at its selection line input, and provides to the decision signal 340 a decision that is the same as the decision for the last bit. In another example, the current bit is an even bit. Accordingly, it is determined that the last bit is an odd bit, and the decision for the last bit stored in the register 438 is sent to a selection device 424 using a signal 422. The selection device 424 receives the signal 434 at its selection line input, and provides to the decision signal 342 a decision providing a chosen adjusted signal that is the same as the chosen adjusted signal provided by the decision for the last bit.

In a particular example, the current bit is an even bit N1 following an even bit N0 and an odd bit P1. After the decision generation circuit 306 determines that two immediately preceding bits N0 and P1 have the same value, a decision that is the same as the decision provided for the last bit P1 is provided for the current bit N1 at decision signal 342. The decisions for the current bit N1 and the last bit P1 are associated with the same one of the gated signals 316 and 318. In an example, both decisions for the current bit N1 and the last bit P1 are associated with AND gated signal 316, and provide for selecting sample N1+ and sample P1+ respectively. In another example, both decisions for the current bit N1 and the last bit P1 are associated with OR gated signal 318, and provide for selecting sample N1− and sample P1− respectively.

Similarly, in an example where the current bit is an odd bit P1 following an odd bit P0 and an even bit N0, the decision for the current bit P1 and decision for the last bit N0 are associated with the same one of the gated signals 316 and 318. In an example, both decisions for the current bit P1 and the last bit N0 are associated with AND gated signal 316, and provide for selecting sample P1+ and sample N0+ respectively. In another example, both decisions for the current bit P1 and the last bit N0 are associated with OR gated signal 318, and provide for selecting sample P1− and sample N0− respectively.

In some embodiments, after determining that P_D and N_D have different values, the decision generation circuit 306 determines that a decision for the current bit is different from the decision for the last bit. In an example, the current bit is an even bit. Accordingly, it is determined the last bit is an odd bit, and the decision for the last odd bit stored in register 428 is sent to a selection device 436 using the signal 430. The selection device 436 receives signal 434 at its selection line input, and provides to the decision signal 340 a decision that is different from the decision for the last bit. In another example, the current bit is an odd bit. Accordingly, it is determined the last bit is an even bit, and the decision for the last bit stored in a register 438 is sent to a selection device 424 using signal 422. The selection device 424 receives signal 434 at its selection line input, and provides to decision signal 342 a decision that is different from the decision for the last bit.

In a particular example, the current bit is an even bit N1 following an even bit N0 and an odd bit P1. After the decision generation circuit 306 determines that two immediately preceding bits N0 and P1 have different values, a decision that is different from the decision provided for the last bit P1 is provided for the current bit N1 at decision signal 342. For example, where the decision for the last bit P1 is associated with one of the AND gated signal 316 and OR gated signal 318, the decision generation circuit 306 determines that the decision for the current bit N1 is associated with the other of the AND gated signal 316 and OR gated signal 318. In an example, the decision for the last bit P1 is associated with AND gated signal 316, and provides for selecting sample P1+. In such an example, the decision generation circuit 306 generates a decision for the current bit N1 associated with OR gated signal 318, which provides for selecting sample N1−. In another example, the decision for the last bit P1 is associated with OR gated signal 318, and provides for selecting sample P1−. In such an example, the decision generation circuit 306 generates a decision for the current bit N1 associated with AND gated signal 318, which provides for selecting sample N1+.

Similarly, in an example where the current bit is an odd bit P1 following an odd bit P0 and an even bit N0, the decision generation circuit 306 determines that two immediately preceding bits P0 and N0 have different values. A decision that is different from the decision provided for the last bit N0 is provided for the current bit P1 at the decision signal 340. In an example, the decision for the last bit N0 is associated with AND gated signal 316, and provides for selecting sample N0+. In such an example, the decision generation circuit 306 generates a decision for the current bit P1 associated with OR gated signal 318, which provides for selecting sample P1−. In another example, the decision for the last bit N0 is associated with OR gated signal 318, and provides for selecting sample N0−. In such an example, the decision generation circuit 306 generates a decision for the current bit P1 associated with AND gated signal 318, which provides for selecting sample P1+.

Referring to FIG. 4C, illustrated is a timing diagram of the ISI compensation circuit 300 of FIG. 3A including the decision generation circuit 306 of FIG. 4B. Curve 450 illustrates generating a decision in the decision signal 340 for the selection circuit 304 for an odd bit P1 following bits P0 and N0. During a time period between t1 and t3, two samples P1+ and P1− of the odd bit P1 are stored in the samplers 320 and 322 respectively. A decision is made for selecting from those two samples P1+ and P1− based on P0_D in signal 418 provided by register 412 and N0_D in signal 420 provided by register 414 (as shown with "X" intersecting curve 450). By the rising edge 452 of PDQS 328 at time t3, the chosen sample for P1 is provided by the selection circuit 304 based on the decision in the decision signal 340, and is moved into register 412 and available at signal 418 as shown in the waveform for signal 418.

Similarly, curve 454 illustrates generating a decision in signal 342 for the selection circuit 304 for an even bit N1 following bits N0 and P1. During a time period between t2 and t4, two samples N1+ and N1− of the even bit N1 are stored in the samplers 324 and 326 and available at sample signals 336 and 338 respectively. A decision is made for selecting from those two samples N1+ and N1− based on P1_D in signal 418 provided by register 412 and N0_D in signal 420 provided by register 414 (as shown with "X" intersecting curve 454). By the rising edge 456 of NDQS 330 at time t4, the chosen sample for N1 is provided by the selection circuit 304 based on the decision in signal 342, and is moved into register 414 and available at signal 420.

As shown by curves 450 and 454, in some embodiments, there is a timing requirement between data stored in register 414 and PDQS 328, and a timing requirement between data stored in register 412 and NDQS 330. For example, N0_D may need to be moved in register 414 prior to a rising edge of PDQS 328 (e.g., time t3). For further example, P1_D may need to be moved in register 412 and available at signal 418 prior to a rising edge NDQS 330 (e.g., time t4). Because N0_D and P1_D are generated based on NDQS 330 and PDQS 328 respectively, those timing requirements become timing requirements between PDQS 328 and NDQS 330, which may be satisfied by providing NDQS 330 and PDQS 328 that have tight timing relationships. In some examples, NDQS 330 and PDQS 328 have the same clock period, and have a timing relationship such that distance from a rising edge of PDQS 328 (e.g., time t3) to a rising edge of NDQS 330 (e.g., time t4) is equal to half that period. In some examples, odd bits P and even bits N in the DQ signal 308 are random data, and over enough random data, P and N data eyes exhibit identical composite eyes. In such examples, rising edges of PDQS 328 and NDQS 330 may be placed in the center of their respective P and N composite eyes, and may be one unit internal (UI) apart.

Figure 5:
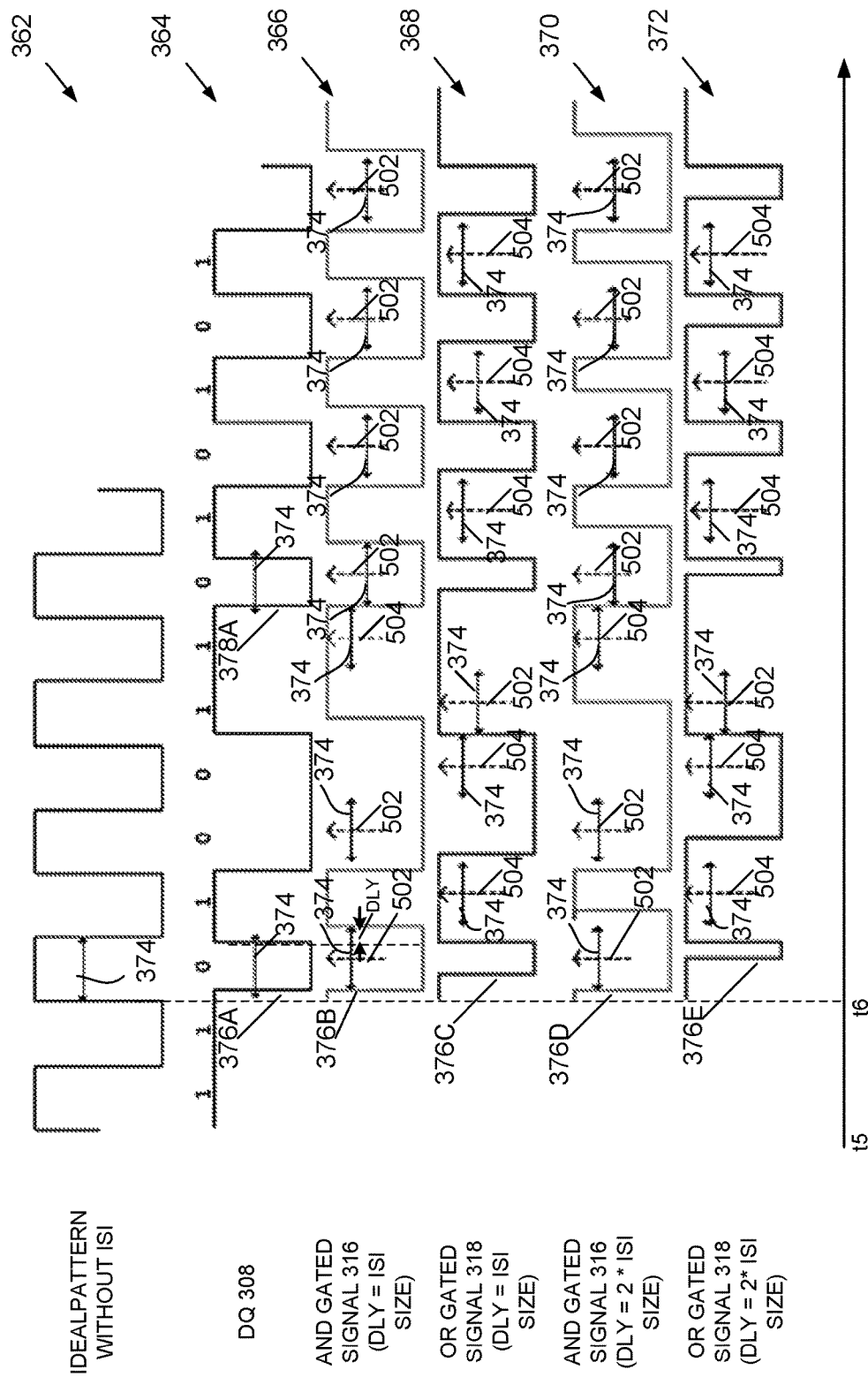
FIG. 5 illustrates a timing diagram of the exemplary ISI compensation circuit of FIG. 3A according to some embodiments of the present disclosure.

Referring to FIG. 5, in various embodiments, decision signals 340 and 342 generated as described above with reference to FIGS. 4A, 4B, and 4C ensure that for each bit, a sample having a timing margin at least equal to an ideal bit period for sampling is selected from samples generated using bit-period adjusted signals 316 and 318. Illustrated in FIG. 5 is an exemplary timing diagram for the ISI compensation circuit 300. Arrows 502 and 504 indicate the decisions provided by decision signals 340 and 342. Note that by performing a priming process as discussed above with reference to FIG. 4A, during an idle period between times t5 and t6, the first two values of the DQ signal 308 have the same value of one.

In the illustrated example, in waveforms 366 and 368, arrows 502 mark the sampling edges (e.g., rising edges) of PDQS 328 for sampling the odd bits, and arrows 504 mark the sampling edges (e.g., rising edges) of NDQS 330 for sampling the even bits. The positions of these arrows 502 and 504 indicate the decisions for selecting a sample from a first sample (e.g., P+, N+) generated from the AND gated signal 316 and a second sample (e.g., P−, N−) generated from the OR gated signal 318. As shown in waveforms 366 and 368, arrows 502 and 504 pass through the center of lines indicating an ideal bit period 374, where each bit selected by the arrows 502 and 504 has a bit period equal to or larger than ideal bit period 374. As such, each chosen sample for the selected bit indicated by arrows 502 and 504 has a timing margin at least equal to the ideal bit period 374.

Similarly, as illustrated by waveforms 370 and 372, increasing the delay period to twice the ISI size does not affect the performance of the ISI compensation circuit 300. Each chosen sample for the selected bit indicated by arrows 502 and 504 in waveforms 370 and 372 has a timing margin at least equal to the ideal bit period 374. In some embodiments, the delay period DLY may be increased to one ideal bit period plus one ISI size without having a negative effect on the performance of the ISI compensation circuit 300.

It is noted that various configurations illustrated in FIGS. 3A, 3B, 4A, 4B, 4C, and 5 are exemplary only and not intended to be limiting beyond what is specifically recited in the claims that follow. It will be understood by those skilled in that art that other configurations may be used. For example, the adjustment circuit may use devices other than ADD and OR gates and apply functions other than AND and OR functions for adjusting the bit periods of the bits.

Various advantages may be present in various applications of the present disclosure. No particular advantage is required for all embodiments, and different embodiments may offer different advantages. One of the advantages of some embodiments is that by performing the ISI compensation in digital circuits after an analog receive signal has been digitized, the ISI compensation circuit may be implemented with standard low power CMOS circuits. As such, reduced power consumption may be achieved compared to ISI compensations performed in analog circuits of the receiver requiring a higher supply voltage. Another advantage of some embodiments is the delay period used for adjusting bit periods to recover sampling margin may be any value within a range and is not required to have an accurate value. Accordingly, the ISI may be completely removed without accurately determining a delay period provided by a delay unit, which may improve bit error rate performance. Yet another advantage of some embodiments is that because the ISI compensation circuit may completely remove the ISI, a DFE may not be needed in a receiver. As such, area savings may be achieved as the ISI compensation circuit may consume less area than the DFE. Yet another advantage of some embodiments is that the ISI compensation circuit may coexist with and complement other ISI compensation approaches (e.g., using a DFE) in a receiver to meet various bit error rate performance, area, and/or power requirements.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An intersymbol interference (ISI) compensation circuit, comprising:
  a data input for receiving an input data signal including a plurality of bits;
  an adjustment circuit configured to adjust bit periods of the plurality of bits to generate a first adjusted signal and a second adjusted signal, wherein the adjustment circuit includes:
    a first adjustment unit configured to generate the first adjusted signal by increasing bit periods of a first group of bits in the input data signal having a first value and decreasing bit periods of a second group of bits in the input data signal having a second value;
  a sampling circuit configured to generate a first sample signal by sampling the first adjusted signal, and generate a second sample signal by sampling the second adjusted signal;
  a decision generation circuit configured to provide a first decision for a first bit, wherein the first decision provides a chosen adjusted signal that is one of the first and second adjusted signals; and
  a selection circuit configured to determine a compensated value of the first bit based on a chosen sample signal that is one of the first and second sample signals, wherein the chosen sample signal is generated by sampling the chosen adjusted signal.

2. The ISI compensation circuit of claim 1, wherein the adjustment circuit comprises:
  a second adjustment unit configured to generate the second adjusted signal by decreasing bit periods of the first group of bits and increasing bit periods of the second group of bits.

3. The ISI compensation circuit of claim 1, wherein the decision generation circuit is configured to:
  generate the first decision for the first bit based on values of a second bit immediately preceding the first bit and a third bit immediately preceding the second bit.

4. The ISI compensation circuit of claim 3, wherein the decision generation circuit is configured to:
  compare compensated values of the second bit and the third bit to generate a comparison result; and
  provide the first decision for the first bit determined according to the comparison result.

5. The ISI compensation circuit of claim 4, wherein the decision generation circuit is configured to:
  determine that compensated values of the second bit and the third bit are the same and in response, determining that the first decision for the first bit provides the chosen adjusted signal that is the same as a chosen adjusted signal provided by a second decision for the second bit.

6. The ISI compensation circuit of claim 4, wherein the decision generation circuit is configured to:
  determine that compensated values of the second bit and the third bit are different and in response, determining that the first decision for the first bit provides the chosen adjusted signal that is different from a chosen adjusted signal provided by a second decision for the second bit.

7. The ISI compensation circuit of claim 2, wherein the adjustment circuit comprises:

a delay unit configured to delay the input data signal for a delay period to generated a delayed data signal;

wherein the first adjustment unit is configured to perform an AND operation on the input data signal and the delayed data signal to generate the first adjusted signal; and wherein the second adjustment unit is configured to perform an OR operation on the input data signal and the delayed data signal to generate the second adjusted signal.

8. The ISI compensation circuit of claim 7, wherein the first bit is affected by ISI, and wherein the delay period is equal to or greater than a bit-period reduction to the first bit caused by ISI.

9. The ISI compensation circuit of claim 8, wherein a second bit in the input data signal is not affected by ISI and has a first bit period, and wherein the delay period is less than a total of the first bit period and the bit-period reduction.

10. The ISI compensation circuit of claim 1, wherein the sampling circuit comprises:

first and second samplers clocked by a first clock and configured to generate the first and second sample signals for odd bits of the input data signal by sampling the first adjusted signal and second adjusted signal respectively;

third and fourth samplers clocked by a second clock and configured to generate third and fourth sample signals for even bits of the input data signal by sampling the first and second adjusted signals respectively; and wherein the selection circuit configured to:

for an odd bit of the input data signal, determine a compensated value of the odd bit based on a first chosen sample signal that is one of the first and second sample signals, wherein the first chosen sample signal is generated by sampling the chosen adjusted signal; and for an even bit of the input data signal, determine a compensated value of the even bit based on a second chosen sample signal that is one of the third and fourth sample signals, wherein the second chosen sample signal is generated by sampling the chosen adjusted signal.

11. A method, comprising:

receiving an input data signal including a plurality of bits;

adjusting bit periods of the plurality of bits to generate a first adjusted signal and a second adjusted signal, wherein the adjusting bit periods to generate the first adjusted signal includes:

generating the first adjusted signal by increasing bit periods of a first group of bits in the input data signal having a first value and decreasing bit periods of a second group of bits in the input data signal having a second value;

generating a first sample signal by sampling the first adjusted signal;

generating a second sample signal by sampling the second adjusted signal;

providing a first decision for a first bit, wherein the first decision provides a chosen adjusted signal that is one of the first and second adjusted signals; and determining a compensated value of the first bit based on a chosen sample signal that is one of the first and second sample signals, wherein the chosen sample signal is generated by sampling the chosen adjusted signal.

12. The method of claim 11, comprising:

generating the second adjusted signal by decreasing bit periods of the first group of bits and increasing bit periods of the second group of bits.

13. The method of claim 11, comprising:

generating the first decision for the first bit based on values of a second bit immediately preceding the first bit and a third bit immediately preceding the second bit.

14. The method of claim 13, comprising:

comparing compensated values of the second bit and the third bit to generate a comparison result; and providing the first decision for the first bit determined according to the comparison result.

15. The method of claim 14, comprising:

determining that compensated values of the second bit and the third bit are the same and in response, determining that the first decision for the first bit provides the chosen adjusted signal that is the same as a chosen adjusted signal provided by a second decision for the second bit.

16. The method of claim 14, comprising:

determining that compensated values of the second bit and the third bit are different and in response, determining that the first decision for the first bit provides the chosen adjusted signal that is different from a chosen adjusted signal provided by a second decision for the second bit.

17. The method of claim 12, comprising:

delaying the input data signal for a delay period to generated a delayed data signal;

performing an AND operation on the input data signal and the delayed data signal to generate the first adjusted signal; and performing an OR operation on the input data signal and the delayed data signal to generate the second adjusted signal.

18. The method of claim 17, wherein the first bit is affected by intersymbol interference (ISI), and wherein the delay period is equal to or greater than a bit-period reduction to the first bit caused by ISI.

19. The method of claim 18, wherein a second bit in the input data signal is not affected by ISI and has a first bit period, and wherein the delay period is less than a total of the first bit period and the bit-period reduction.

20. The method of claim 11, comprising:

generating the first and second sample signals for odd bits of the input data signal by sampling the first adjusted signal and second adjusted signal respectively using a first clock;

generating third and fourth samplers clocked by a second clock different from the first clock and configured to generate third and fourth sample signals for even bits of the input data signal by sampling the first and second adjusted signals respectively;

for an odd bit of the input data signal, determining a compensated value of the odd bit based on a first chosen sample signal that is one of the first and second sample signals, wherein the first chosen sample signal is generated by sampling the chosen adjusted signal; and for an even bit of the input data signal, determining a compensated value of the even bit based on a second chosen sample signal that is one of the third and fourth sample signals, wherein the second chosen sample signal is generated by sampling the chosen adjusted signal.

* * * * *